US011132484B1

(12) United States Patent
Neuveux et al.

(10) Patent No.: US 11,132,484 B1
(45) Date of Patent: Sep. 28, 2021

(54) CONTROLLING CLOCKS AND RESETS IN A LOGIC BUILT IN SELF-TEST

(71) Applicant: Synopsys, Inc., Mountain View, CA (US)

(72) Inventors: Frederic Neuveux, Grenoble (FR); Salvatore Talluto, Gavirate (IT)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/062,182

(22) Filed: Oct. 2, 2020

Related U.S. Application Data

(60) Provisional application No. 62/910,510, filed on Oct. 4, 2019.

(51) Int. Cl.
*G06F 30/33* (2020.01)
*G06F 30/333* (2020.01)
*G06F 30/398* (2020.01)
*G06F 1/06* (2006.01)
*G01R 31/3177* (2006.01)
*G06F 7/58* (2006.01)

(52) U.S. Cl.
CPC .......... *G06F 30/33* (2020.01); *G01R 31/3177* (2013.01); *G06F 1/06* (2013.01); *G06F 7/582* (2013.01); *G06F 30/333* (2020.01); *G06F 30/398* (2020.01)

(58) Field of Classification Search
CPC ...... G06F 30/33; G06F 30/333; G06F 30/398; G06F 1/06; G06F 7/582; G01R 31/3177
USPC ............................ 716/136, 106, 111; 703/15
See application file for complete search history.

(56) References Cited

U.S. PATENT DOCUMENTS 10,615,954 B2 * 4/2020 Ye ........................ H04L 7/0079
2010/0218061 A1 * 8/2010 Sinanoglu ...... G01R 31/318547
714/731

* cited by examiner

*Primary Examiner* — Phallaka Kik
(74) *Attorney, Agent, or Firm* — Sterne, Kessler, Goldstein & Fox P.L.L.C.

(57) ABSTRACT

A method for testing a design is provided. The method includes generating a sequence of bits, mapping the sequence of bits to a combination, and generating an enable signal based on the combination. The enable signal enables an asynchronous signal in the design. The method also includes driving an element of the design based on the enabled asynchronous signal.

20 Claims, 10 Drawing Sheets

CONTROLLING CLOCKS AND RESETS IN A LOGIC BUILT IN SELF-TEST

CROSS-REFERENCE TO RELATED APPLICATIONS

The present application claims the benefit under 35 U.S.C. § 119(e) of U.S. Provisional Patent Application No. 62/910,510 filed on Oct. 4, 2019, which is incorporated herein by reference in its entirety for all purposes.

TECHNICAL FIELD

The present disclosure relates to a logic built in self-test. In particular, the present disclosure relates to controlling clocks and resets in the logic built in self-test.

BACKGROUND

Logic built in self-test (BIST) architectures are designed to apply pseudo-random patterns generated on-chip to minimize externally provided data. In a logic BIST architecture, clocks and resets are pulsed in a pre-defined sequence to avoid interactions between asynchronous interacting domains during a capture phase. Otherwise, patterns may fail on the application invalidating the testing.

Clocks in a circuit may drive sequential elements (e.g., flip-flops, registers, latches) which interact with each other (i.e., there is a combinational path between elements of different clock domains where a flip-flop/register (ff1) pulsed by one clock (ex. clkA) produce data (Q) which reach, through the combinational path the input (D) of another flop (ff2) pulsed by a different clock (ex. clkB). If two clock domains interact, the respective clocks cannot be pulsed simultaneously during the capture phase to avoid unexpected or unpredictable response. Consequently, multiple asynchronously interacting clocks require multiple intervals. As an example, if the device has 10 asynchronous non-groupable clocks and one asynchronous reset (i.e., a total of 11 asynchronous signals), the logic BIST execution may require 11 separate intervals, where in each interval only one of the asynchronous clocks and resets is pulsed during capture. Each one of these intervals can require additional data to be stored on-chip, thus reducing the efficiency of the logic BIST testing and increasing test time and test data storage requirements.

SUMMARY

In one aspect, a method for testing a design is provided. The method includes generating a sequence of bits, mapping the sequence of bits to a combination, and generating an enable signal based on the combination. The enable signal enables an asynchronous signal in the design. The method also includes driving an element of the design based on the enabled asynchronous signal.

In one aspect, a system includes a memory storing instructions, and a processor, coupled with the memory and to execute the instructions. The instructions when executed cause the processor to generate a sequence of bits, map the sequence of bits to a combination, and generate an enable signal based on the combination. The enable signal enables an asynchronous signal in the design. The processor is configured to drive an element of the design based on the enabled asynchronous signal.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to controlling clocks and resets in a logic built in a logic built in self-test (BIST) architecture. The approaches described herein include controlling multiple synchronous and/or asynchronous clock and/or resets in the logic BIST architecture with a single seed and signature interval or a test sequence.

Multiple asynchronously interacting clocks may require multiple intervals. As each interval requires data to be stored on-chip to apply the interval, designs with many asynchronous interactive clocks may require a significant number of intervals to be tested adequately (reaching the target test coverage). Storing all of the interval data requires significant on-chip memory. The cost of the chip area occupied by the memory may be excessive and impact the feasibility of the chip. The present system and method reduces test time and improves fault detection when the logic BIST is used in designs with multiple asynchronous clocks and resets. In some embodiments, the present system and method can be used to pulse any combination of groupable and ungroupable clocks.

The present system and method further enables testing of any combination of asynchronous clocks and resets safely within a single interval. Further, the approaches described herein do not create dependencies between interacting clock domains which impact negatively the reachable test coverage.

Figure 1:
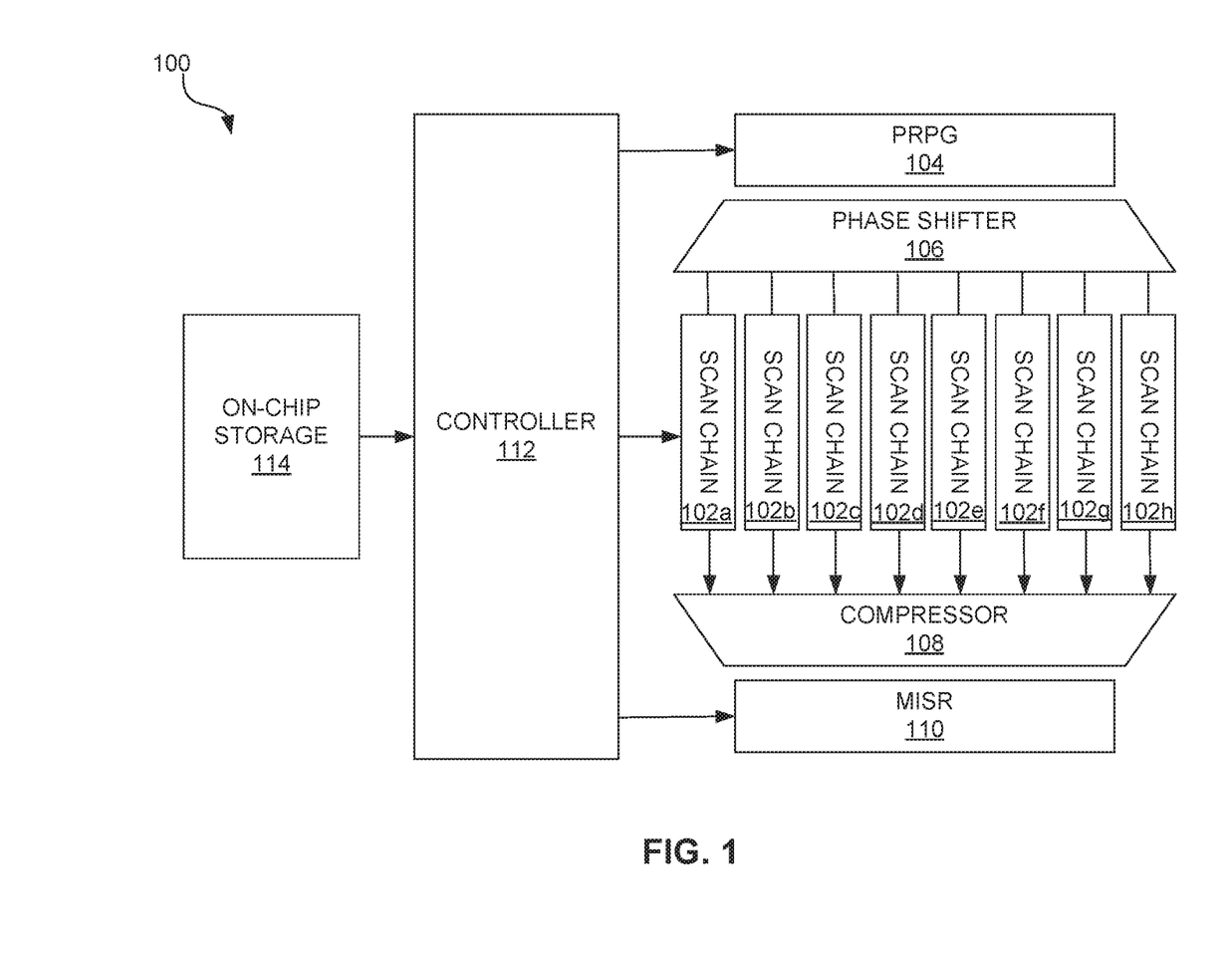
FIG. 1 illustrates an example logic built in self-test (BIST) architecture, in accordance with an embodiment of the present disclosure.
Figure 2A:
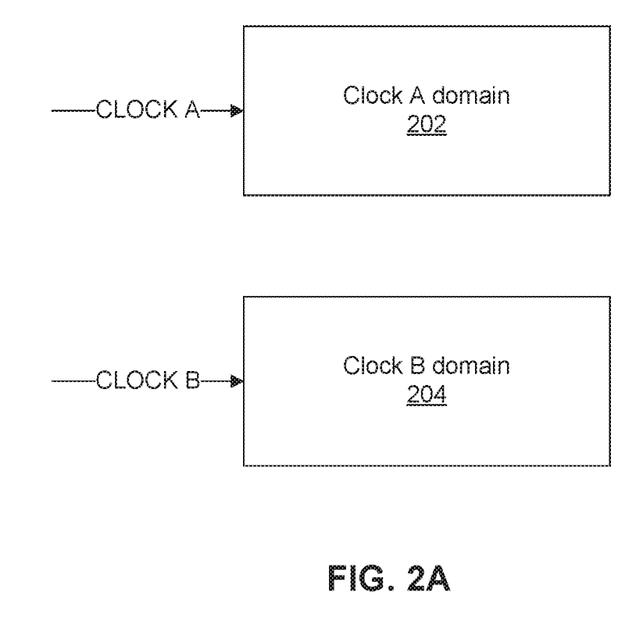
FIG. 2A illustrates an example of non-interacting clock domains, in accordance with an embodiment of the present disclosure.

FIG. 1 illustrates an example logic BIST architecture, in accordance with an embodiment of the present disclosure. A logic BIST architecture 100 can be used to test a design that includes eight scan chains 102a, 102b, 102c, 102d, 102e, 102f, 102g, and 102h. In some embodiments, the logic BIST architecture 100 includes a pseudorandom pattern generator (PRPG) 104, a phase shifter 106, a compressor 108, a multiple input signature register (MISR) 110, a controller 112, and an on-chip storage 114. The PRPG 104 generates a bit sequence for the phase shifter 106 to transform into uncorrelated signals. The values from the PRPG are loaded into the scan chains 102a, 102b, 102c, 102d, 102e, 102f, 102g, and 102h. The compressor 108 compresses the output of the test design and provides inputs to the MISR 110. The controller 112 may control the PRPG 104, the scan chain 102a, 102b, 102c, 102d, 102e, 102f, 102g, 102h, and the MISR 110. The on-chip storage 114 may store seeds and signatures. The "seeds" are the initial value loaded in the PRPG/LFSR (Pseudo Random Pattern Generator). Each different seed may produce a different sequence of patterns. For example, the seeds may be provided to the PRPG 104 to generate test patterns for propagating down the scan chains 102a, 102b, 102c, 102d, 102e, 102f, 102g, and 102h. The "signatures" are the status of the MISR 110 (used as Signature Analyzer) at the end of the execution of the patterns, during the application of the patterns the MISR 110 evolves predictably and the final signature in computed to be stored in the on-chip storage 114. The final signature is compared with the actual signature measured on-silicon. Any defect on real silicon can produce a change in the evolution of the MISR state, and produce a different final signature. The seeds may be loaded into the PRPG 104 at the start of an interval (i.e., test interval). The interval includes loading the initial seed in the PRPG 104, loading a pattern counter with the number of patterns that can be executed, starting the execution (data from PRPG 104 shifted in the scan-chains, applying capture. The shifting and capture operation are repeated as many times as defined by the pattern counter. The interval also includes unloading the MISR final state and comparing with the expected signature. The sequence can be repeated multiple times, in that case we say we apply multiple intervals FIG. 2A illustrates an example of non-interacting clock domains, in accordance with an embodiment of the present disclosure. A clock A domain 202 and a clock B domain 204 are not interacting and do not exchange any signals during testing. The clock domain 202 and the clock domain 204 can be pulsed simultaneously during capture.

Figure 2B:
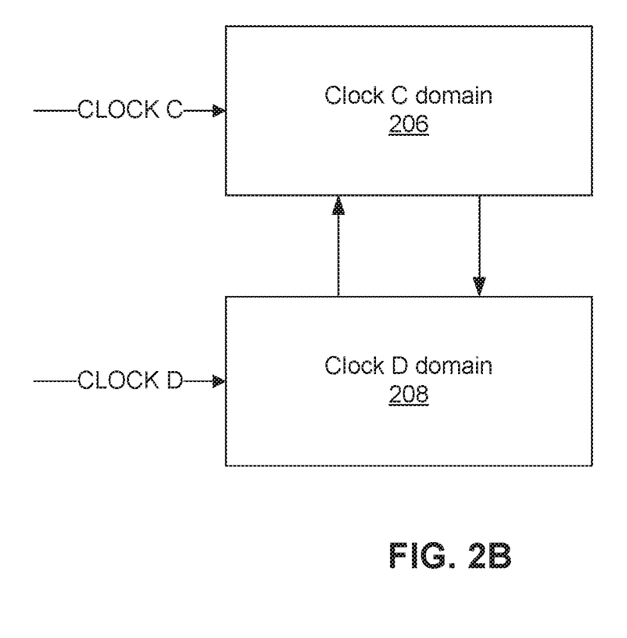
FIG. 2B illustrates an example of interacting clock domains, in accordance with an embodiment of the present disclosure.

FIG. 2B illustrates an example of interacting clock domains, in accordance with an embodiment of the present disclosure. In FIG. 2B, a clock C domain 206 interacts with a clock domain D 208. The clock C domain 206 and the clock D domain 208 may exchange one or more signals during testing (e.g., a signal path between an element in the clock C domain 206 and an element in the clock D domain 208). For example, the clocks drive the CLK pin of flip-flop/registers, the flip-flop/registers outputs are connected directly or through some combinational logic the D input of other flip-flop/registers. The paths between Q and D are the signal paths. Thus, the clock domain 206 and the clock domain 208 may not be pulsed simultaneously during capture.

Figure 3:
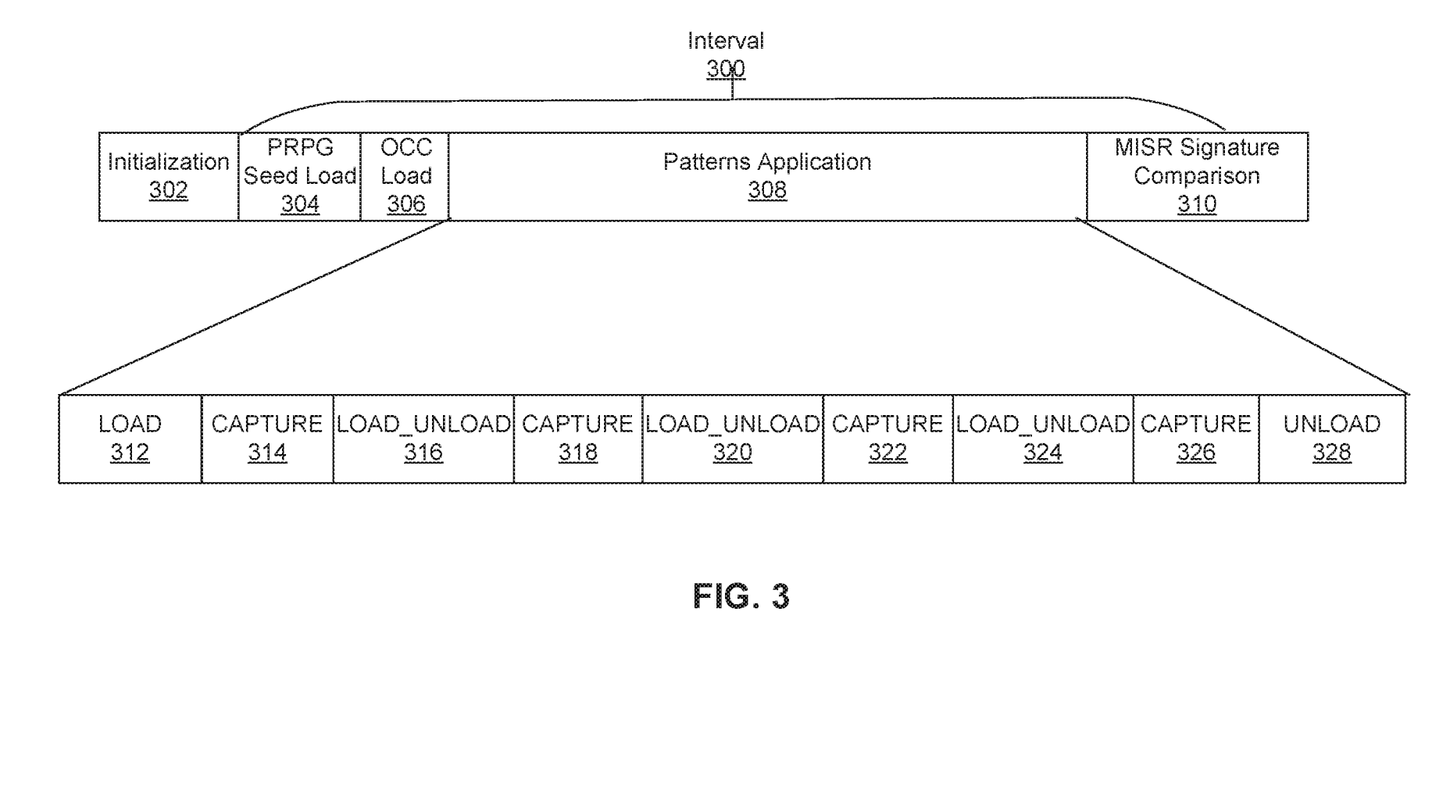
FIG. 3 illustrates an example interval, in accordance with an embodiment of the present disclosure.

FIG. 3 illustrates an example interval, in accordance with an embodiment of the present disclosure. During initialization 302, an initial configuration of the circuitry is applied. An interval 300 may include loading the PRPG 104 with the initial value (seed) 304, an OCC load 306 which load the OCC clock chains with the pre-defined clock configuration enablement, a patterns application 308 sequence including scanning chain load and unload followed by capture repeated multiple times, and downloading a final signature 310 from the MISR 110. The patterns application 308 includes multiple load and/or unload 312, 316, 320, 324, and 328 and capture 314, 318, 322, and 326. During load or unload, the values in the scan chain are shifted (e.g., 102a-102h). During capture, clocks associated with non-interacting domains are pulsed to capture the test circuit response. An on-chip clock controller (OCC) load may specify which clocks can be pulsed together. For multiple intervals, the OCC loads are stored in the on chip storage 114.

Figure 4A:
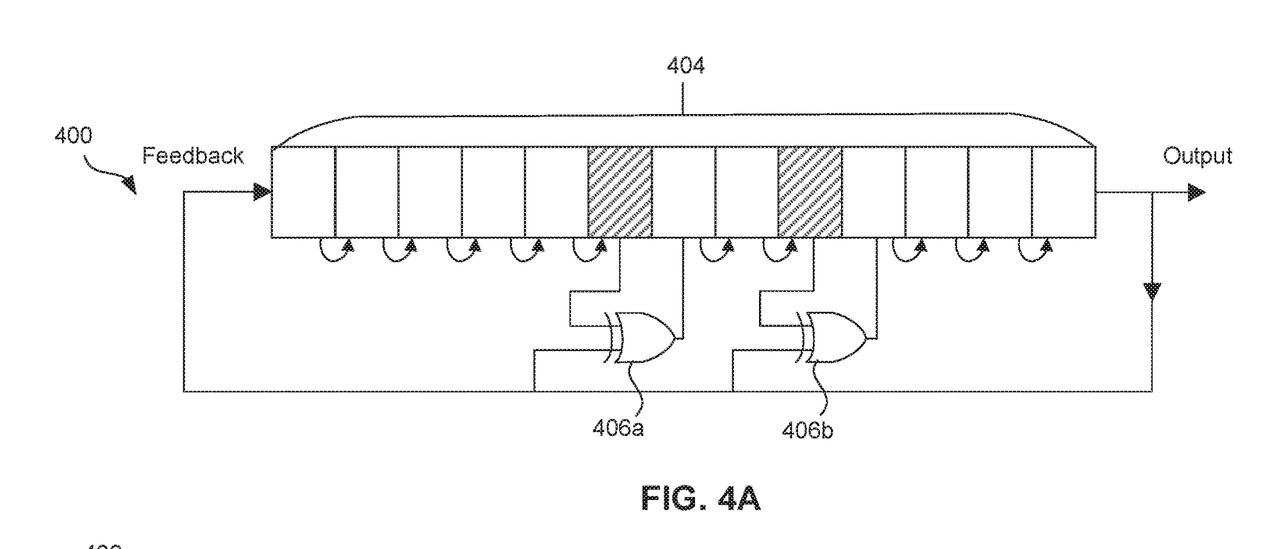
FIG. 4A illustrates an example linear feedback shift register (LFSR) used as a pseudo random pattern generator (PRPG), in accordance with an embodiment of the present disclosure.

FIG. 4A illustrates an example linear feedback shift register (LFSR) used as a PRPG, in accordance with an embodiment of the present disclosure. A circuit 400 of an LFSR may be used to implement the PRPG 104 in FIG. 1. The circuit 400 creates a pseudo-random pattern based on a primitive polynomial. The circuit 400 of the LFSR includes storage elements 404 to store coefficients of a primitive polynomial and XOR gates 406a, 406b for XOR-gating the corresponding coefficient. The XOR gates 406a and 406b act as a linear feedback. The coefficients of the primitive polynomial are shifted as indicated by the curved arrows. The LFSR evolve its status with a predictable sequence that looks as a random pattern but is totally deterministic. Shaded memory elements 404 are coupled to a respective input of the XOR gates 406a, 406b. Thus, the shaded memory elements 404 are not acting as a shift register as the non-shaded memory elements because they depend on the feedback looped from the output.

Other PRPG implementations may be used in the logic BIST architecture 100 as would be understood by one of ordinary skill in the art.

Figure 4B:
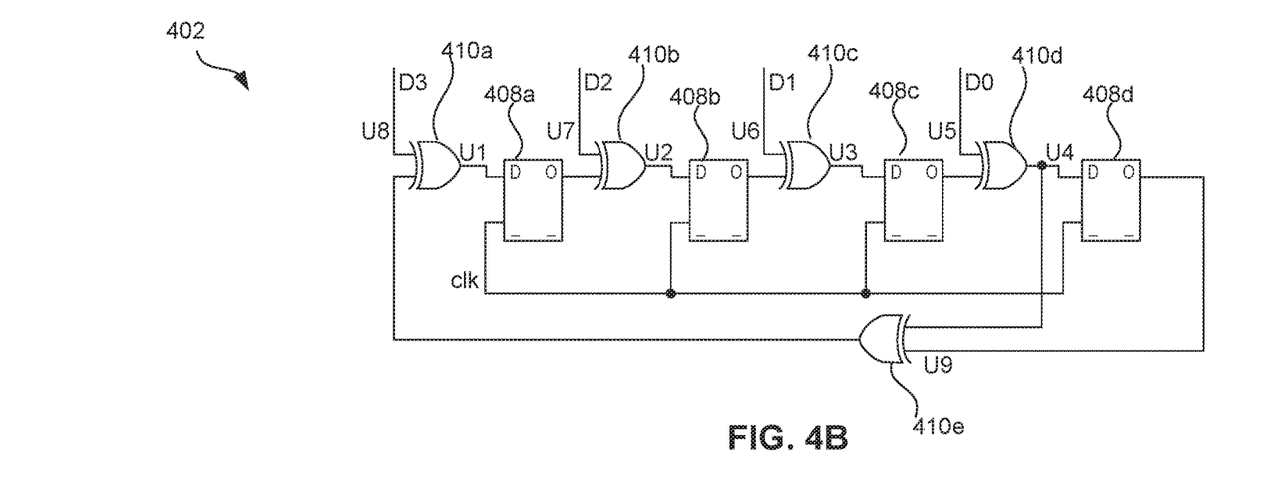
FIG. 4B illustrates an example multiple input shift register (MISR) used as a signature analyzer, in accordance with an embodiment of the present disclosure.

FIG. 4B illustrates an example MISR used as a signature analyzer, in accordance with an embodiment of the present disclosure. A circuit 402 for a MISR may be used to implement the MISR 110 in FIG. 1. The conventional MISR has a structure like the conventional LFSR but, in addition to the LFSR, the MISR receives and processes the data D0 to D3 in parallel. The circuit 402 includes latches 408a, 408b, 408c, and 408d and XOR gates 410a, 410b, 410c, 410d, and 410e. The XORs 410a, 410b, 410c, and 410d in FIG. 4B combine (XOR function) the actual value of the MISR state with the parallel input D0, D1, D2, D3 coming from the scan chains so that the MISR evolution depend on the value downloaded by the scan chains. This dependency makes the MISR acting as a signature analyzer. The XOR gate 410e acts as a linear feedback. The circuit 402 may include multiple XOR gates acting as a linear feedback.

In some embodiments, when a logic BIST is implemented in an electronic circuit, the clock sources may be intercepted by one or more OCCs which avoid pulsing the clocks asynchronously and ensure that clock sequences, which drive the sequential elements, are predictable and deterministic.

The OCC can pulse the clocks based on a static configuration preloaded in a dedicated clock chain (e.g., register). The configuration loaded in the clock chain can specify which clock can be pulsed during capture. If two or more clocks do not have any interdomain path (combinational path between different clock domains) and only have intra-domain paths (combinational logic only within the same clock domain), the two or more clocks can be pulsed simultaneously. The two or more clocks are defined as groupable clocks because the clocks can be pulsed simultaneously as a group.

Figure 5:
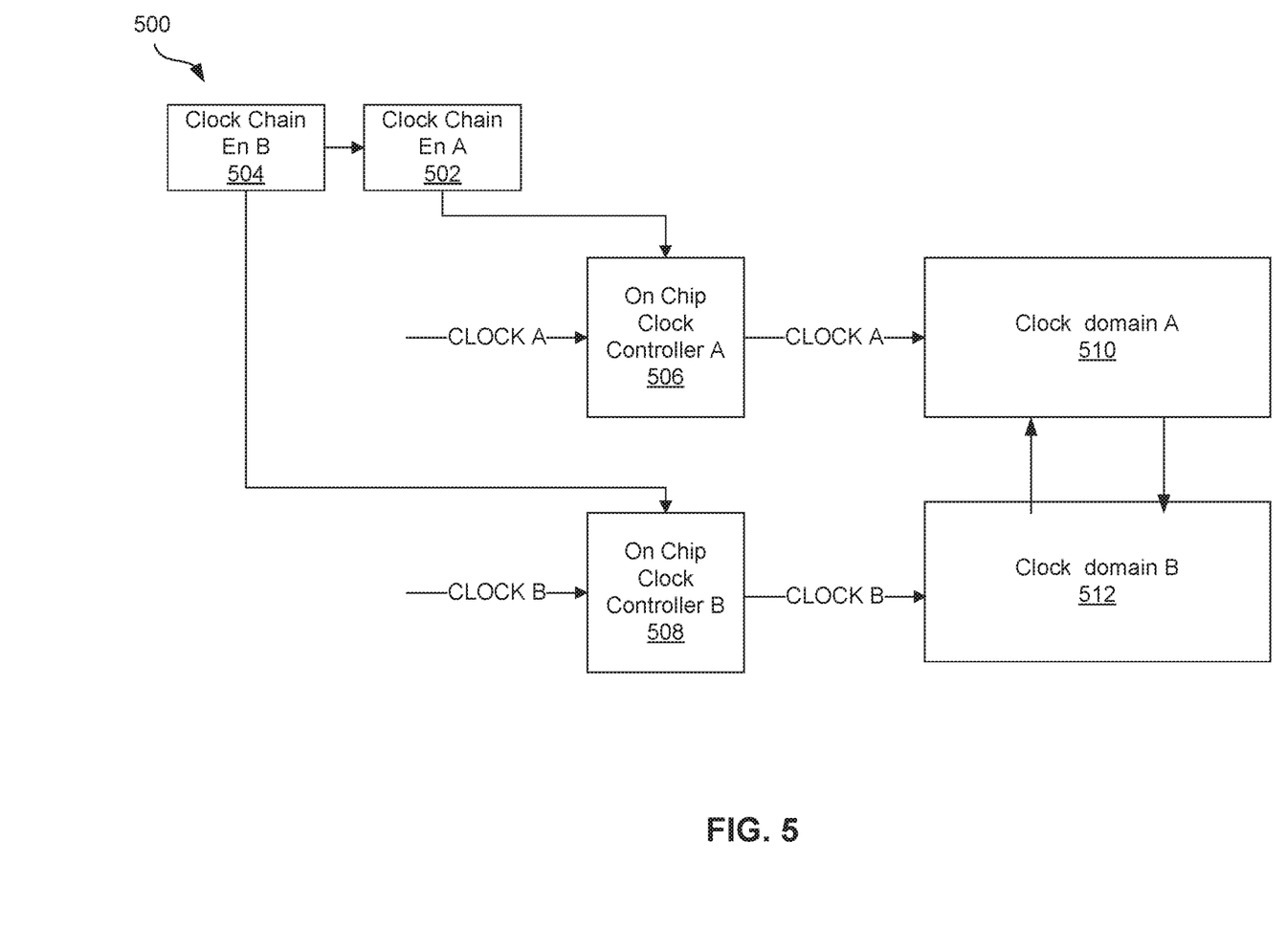
FIG. 5 illustrates an example on chip clocking circuit controlled by a clock chain, in accordance with an embodiment of the present disclosure.

FIG. 5 illustrates an example on chip clocking circuit controlled by a clock chain, in accordance with an embodiment of the present disclosure. A chip clocking circuit 500 includes a clock chain enable (en) A 502, a clock chain enable B 504, a first OCC 506, and a second OCC 508. The first OCC 506 can pulse a clock domain A 510 based on the clock chain enable A 502. The second OCC 508 can pulse a clock domain B 512 based on the clock chain enable B 504. The clock domain A 510 and the clock domain B 512 are interacting (e.g., a combinational path exits between an element (flip-flop/register) driven by the clock domain A 510 and a second element (flip-flop/register) driven by the clock domain B 512). Thus, by loading a value in the clock chain, a proper OCC configuration can be enabled. For example, the proper OCC configuration can enable the OCC 506 and disable the OCC 508 or vice versa. For example, when the clock chain enable A 502 has a value of binary one, the first OCC 506 is enabled.

Figure 6:
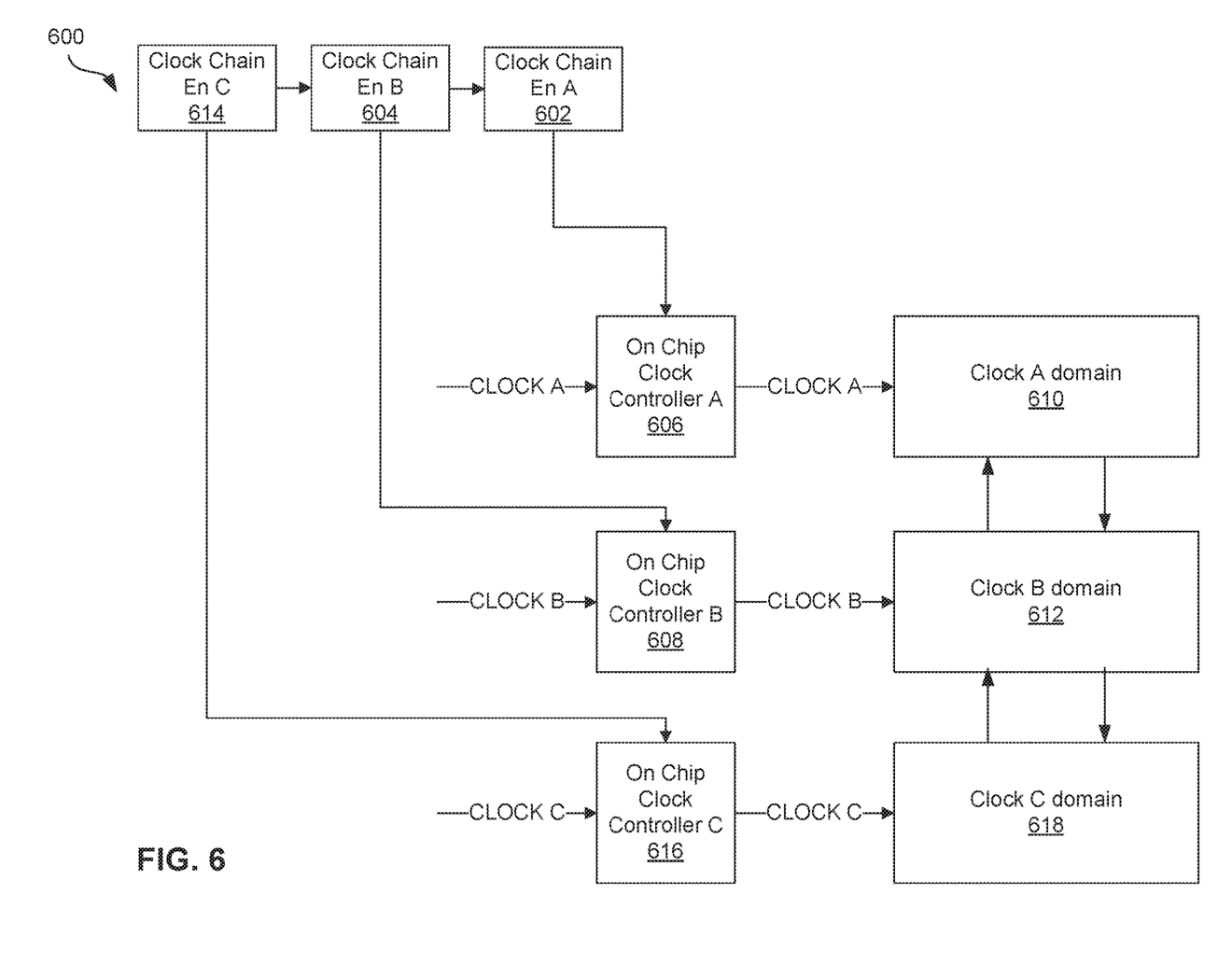
FIG. 6 illustrates a block diagram for a three clock domain management with static clock chain, in accordance with an embodiment of the present disclosure.

FIG. 6 illustrates a block diagram of a circuit including a three clock domain management with static clock chain, in accordance with an embodiment of the present disclosure. A circuit 600 includes three ungroupable asynchronous clock domains: a clock domain A 610, a clock domain B 612, and a clock domain C 618. The circuit 600 also includes three respective on-chip clock controllers: a first OCC 606, a second OCC 608, and a third OCC 616. In some aspects, the first OCC 606 is driven by a clock chain enable A 602. The second OCC 608 is driven by clock chain enable B 604. The third OCC 616 is driven by clock chain enable C 614. The configuration is preloaded at the start of interval (e.g., interval 300 of FIG. 3).

The clock chain enables (e.g., 602, 604, and 614) can be preloaded with one of these configurations: 100, 010, and 001. The circuit 600 may require three intervals to be stored in the on-chip storage 114.

When 100 is preloaded, the clock chain enable C 614 has a value of binary 1, the clock chain enable B 604 has a value of binary 0, and the clock chain enable A 602 has a value of binary 0. Thus, the third OCC 616 is enabled and only clock C (i.e., internal clock C signal) can pulse in capture.

When 010 is preloaded, the clock chain enable C 614 has a value of binary 0, the clock chain enable B 604 has a value of binary 1, and the clock chain enable A 602 has a value of binary 0. Thus, the second OCC 608 is enabled and only clock B can pulse in capture.

When 001 is preloaded, the clock chain enable 614 C has a value of binary 0, the clock chain enable B 604 has a value of binary 0, and the clock chain enable A 602 has a value of binary 1. Thus, the first OCC 606 is enabled and only clock A can pulse in capture.

While in logic BIST, the clock configuration data is preloaded at the beginning of the pattern sequence (e.g., interval 300 of FIG. 3) and remains unchanged for the entire duration of the pattern sequence. Each interval can only pulse a subset of available clocks or groups of clocks and leave other clock domains untested. As described previously herein, multiple intervals are therefore required to test all clock domains exhaustively with an excessive consumption of test data and test time. The method and system described herein change for each capture the clock configuration automatically ensuring always a sequence of valid clock configurations which change every pattern without the need of externally provided data.

In some embodiments, the static programmed configuration defined by the on chip clocking controller clock chain (e.g., chain 502, chain 504) is replaced with a decoded variable configuration or combination which is generated from a random value. In some aspects, the generated configuration enables clocks or clock groups that can be safely pulsed simultaneously.

Figure 7:
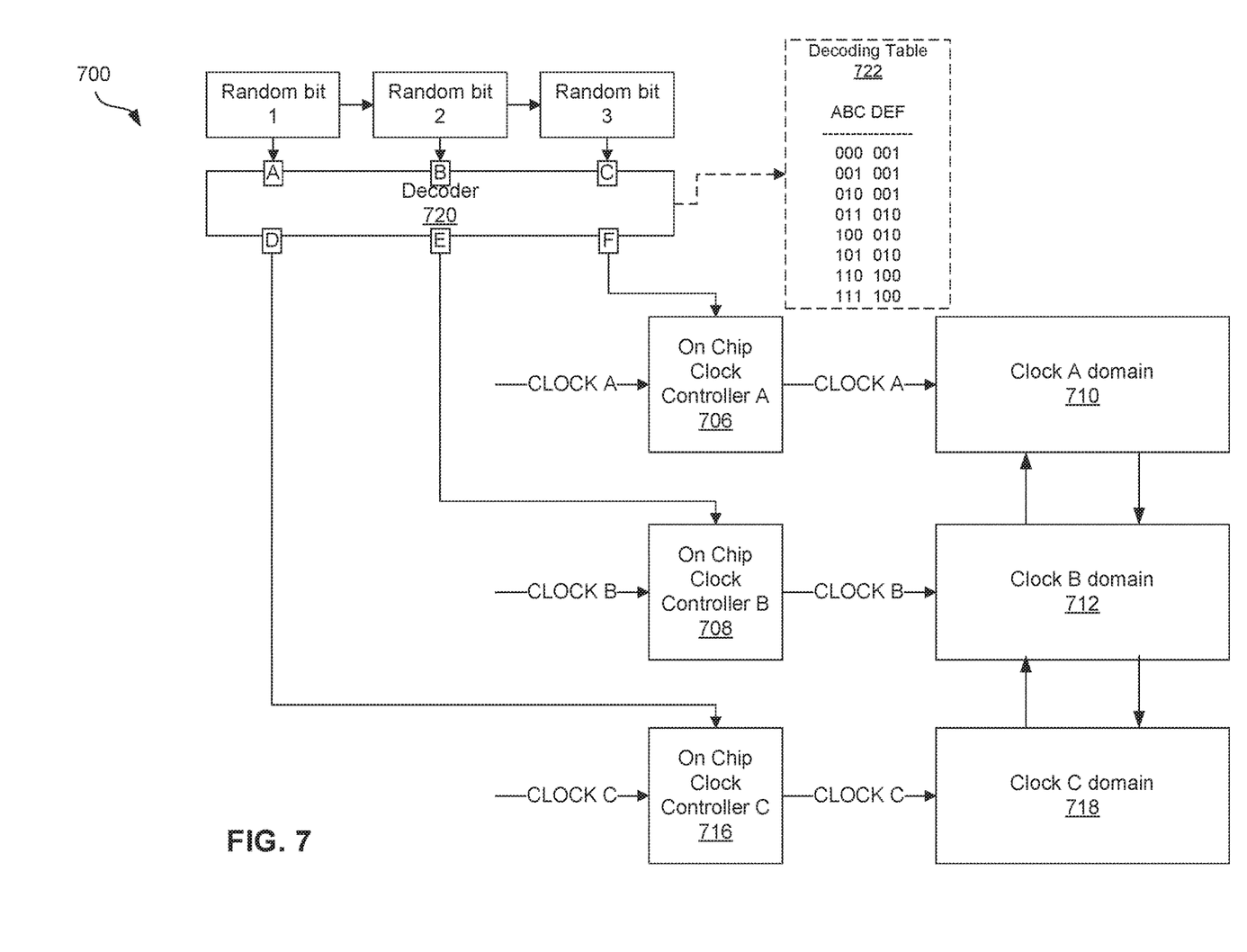
FIG. 7 illustrates a block diagram for a three clock domain management with dynamic random decoding logic, in accordance with an embodiment of the present disclosure.

FIG. 7 illustrates a block diagram for a three clock domain management with dynamic random decoding logic, in accordance with an embodiment of the present disclosure.

In some embodiments, the static clock chain enable A, B, C bits can be replaced with three random bits which change value randomly every pattern. Therefore, the random bits value can be any combination of three bits.

As described previously herein, ungroupable asynchronous clocks that have interacting paths may not be pulsed simultaneously, therefore the random bits value may not be used directly to enable the individual OCCs.

A circuit 700 can include a first OCC A 706, a second OCC B 708, and a third OCC C 716. The first OCC A 706 controls clock signal A. The second OCC B 708 controls the clock signal B. The third OCC 716 controls the clock signal C. The circuit 700 also includes a first clock domain A 710, a second clock domain B 712, and a third clock domain C 718.

The circuit 700 also includes a decoder 720 (i.e., decoding logic). The decoder 720 is added between random bits (e.g., generated by the PRPG 104) and the first OCC A 706, the second OCC B 708, and the third OCC C 712. In other words, an input to the decoder 720 may be a random sequence of bits. An output of the decoder 720 may be coupled to the OCCs of the circuit 700 (i.e., the first OCC A 706, the second OCC B 708, and the third OCC C 712). The decoder 720 may map the random value to an allowed combination. Allowed combinations include combinations of OCC generated clocks that are not exercising any inter-clock domain path but only intra-clock domain paths. The allowed combinations are shown in a decoding table 722 as DEF. In other words, the output of the decoder 720 (i.e., the allowed combination) may enable OCCs that are associated (e.g., coupled) to the clocks that can be pulsed together. In the circuit 700, the output of the decoder 720 may enable one of the first OCC A 706, the second OCC B 708, and the third OCC C 712. Thus, only one clock is pulsed at each capture (because of clock A domain 710, clock B domain 712, and clock C domain are not groupable).

In some embodiments, the decoded value or output of the decoder 720 can enable a valid clock configuration/combination which safely pulse clocks that do not interact. The decoder 722 may map the sequence of bits to allowable combinations based on the decoding table 722. The decoding table 722 can associate each possible input value to an allowable combination.

In some embodiments, a user input may specify the number of combinations (or percentage) that can pulse a respective clock domain. Further, the user input may specify which clocks can be pulsed together. For example, the user input may include a weight for each clock or a group of clocks.

In some embodiments, the weight associated with each clock can be automatically determined. The weight may be determined based on a number of sequential elements associated with the clock domain.

In some embodiments, the number of random bits that can be used to drive the decoding logic can depend on the number of clocks and their respective grouping and on the number of registers clocked by each clock domains. The clocks or group of clocks that drive the majority of the sequential elements require to be pulsed more frequently than the clocks or group of clocks that pulse few sequential elements. The number of faults and the difficulty to detect those faults is generally proportional to the number of sequential elements required to detect the faults. The asynchronous reset and set signals can be rarely enabled by the decoder to minimize the pattern waste for easy detectable faults. Thus, the decoding logic is configured to assign to each clock and/or group of clocks a number of combinations which is proportional to the number of sequential elements driven.

In some embodiments, the approaches described herein may be used to pulse set/reset signals. In some aspects, the set/reset signal are pulsed for a smaller number of captures (compared to clock). Further, asynchronous set/reset signals are not grouped with clocks of the design to minimize timing dependencies.

In some embodiments, the sequence of bits may represent a random variable value. In one embodiment, the random variable value can be generated either by the PRPG or by any existing scan chain of the design or a dedicated scan chain.

Figure 8:
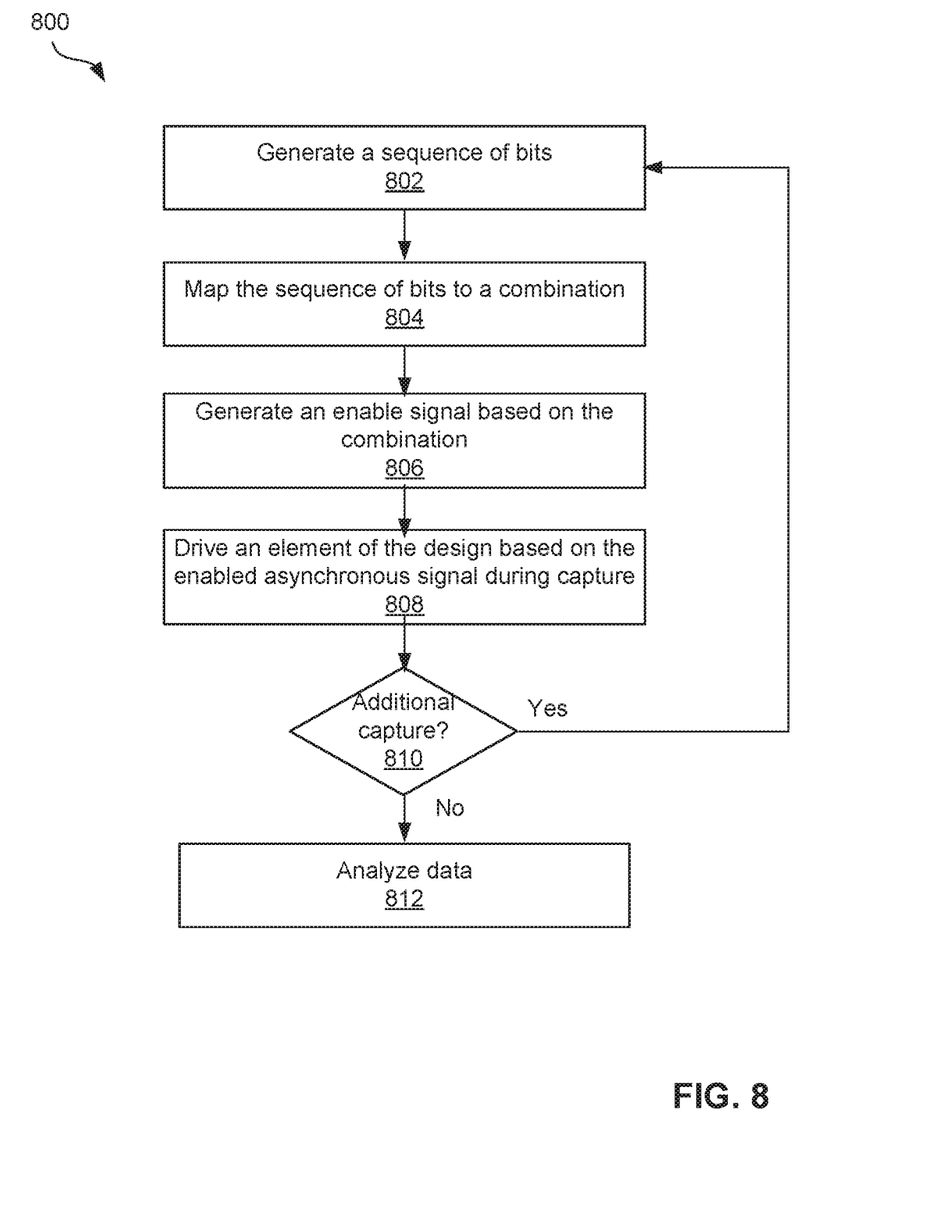
FIG. 8 illustrates a flowchart of a method for controlling asynchronous signals in the BIST, in accordance with an embodiment of the present disclosure.

FIG. 8 illustrates a flowchart of a method for controlling asynchronous signals in the BIST, in accordance with an embodiment of the present disclosure.

At 802, a sequence of bits is generated. The sequence of bits may be a random sequence of bits. The length of the sequence of bits may be determined based on a number of interacting clock domains in the design and a number of elements clocked by each clock domain.

At 804, the sequence of bits is mapped to a combination (allowable combination) by a decoder.

At 806, an enable signal may be generated on the combination. For example, an enable signal for the OCC associated with a clock domain is generated. The enable signal may enable an asynchronous signal (e.g., clock signal, reset signal). A second enable signal may be generated simultaneously with the enable signal. The second enable signal can be associated with a domain that is non-interacting with the domain associated with the enable systems.

At 808, an element of the design is pulsed based on the enabled asynchronous signal during capture.

At 810, a determination is made whether an interval includes an additional capture sequence. In response to determining that the interval includes the additional capture sequence, the process goes back to step 802 and a new random sequence of bits is generated. Then, steps 804-810 are repeated. At 812, data stored in the MISR 110 representing the results of the testing are analyzed. For example, the final MISR outputs a value that is the result of the cumulative analysis of the scan chain outputs through the application of the patterns, which is shifted out serially and compared with the pre-computed "good machine" expected value.

In one example, a design includes 200 registers. 100 registers are clocked by a first clock ClkA and the other 100 registers are clocked by a second clock ClkB. The first clock ClkA and the second clock ClkB are un-groupable because the first clock ClkA and the second clock ClkB have inter clock domains paths. In one aspect, the first clock ClkA and the second clock ClkB may need 50% equal opportunities to be pulsed within an interval. In this case, one single random bit may be enough to produce the proper decoding logic which can enable the clocks to be pulsed. A binary digit 0 may indicate that the first clock ClkA can be pulsed. And, a binary digit equals to zero may indicate that the second clock ClkB can be pulsed.

In another example, a design includes 200 registers. In the design, 50 registers are clocked by a first clock ClkA and the other 150 registers are clocked by a second ClkB. The two clocks are un-groupable because the first clock and the second clock have inter clock domains paths. In one example, the first clock ClkA may need 25% opportunities to be pulsed within an interval and the second clock ClkB may need 75% opportunities. In this case, two random bits may be required to produce the proper decoding logic which can enable the clocks to be pulsed. A binary sequence 00 indicates that the first clock is pulsed. Any of binary sequence 01, 10, or 11 pulse the second clock ClkB. For example, the decoder 720 may map 00 to 10. And, the decoder 720 may map 01, 10, or 11 to 01.

In another example, a design includes 1000 registers, where 10 registers are clocked by the first clock ClkA, 10 registers are clocked by the second clock ClkB and the other 980 registers are clocked by a third clock ClkC. The first clock ClkA and the second ClkB are groupable, therefore they can be pulsed simultaneously. The third clock ClkC is ungroupable. In one example, the first clock ClkA and the second clock ClkB may need 2% opportunities to be pulsed within an interval, while the third clock ClkC may need 98% opportunities. In this case, 7 random bits may be used to produce the proper decoding logic which can enable the clocks to be pulsed. For example, 0000000 and 0000001 may pulse the first clock ClkA and the second clock ClkB. All remaining combinations can pulse the third clock ClkC.

Figure 9:
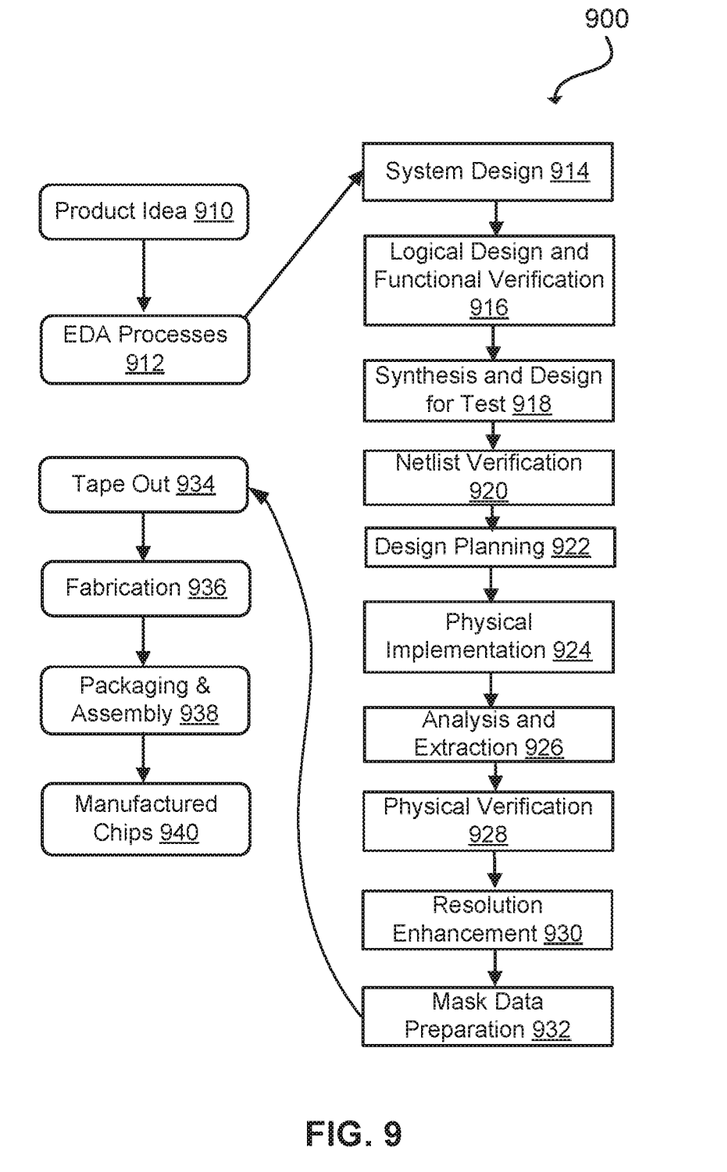
FIG. 9 depicts a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 9. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

Figure 10:
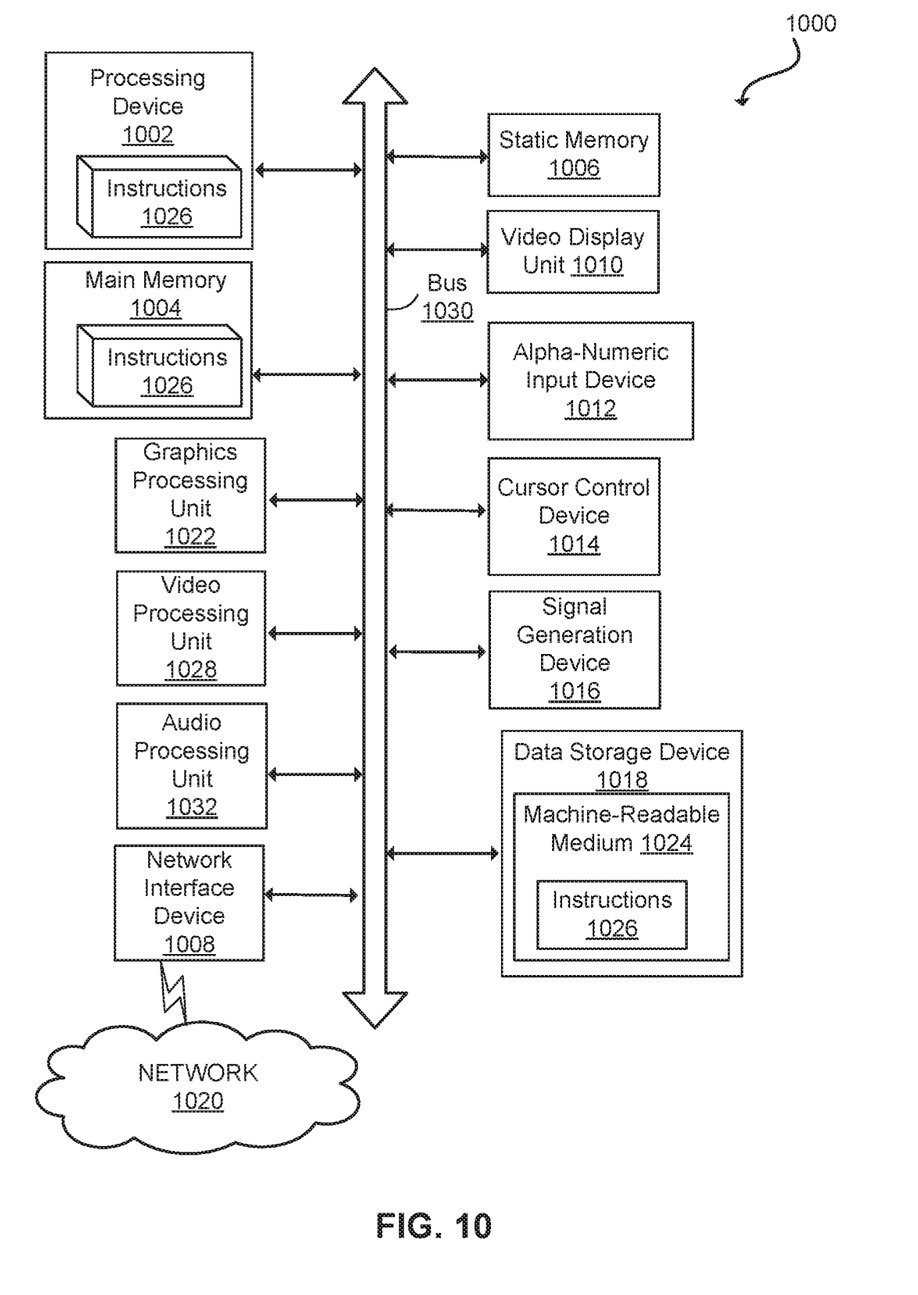
FIG. 10 depicts an abstract diagram of an example computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for testing a design, comprising:
   generating, by a processor, a sequence of bits;
   mapping the sequence of bits to a combination;
   generating an enable signal based on the combination, wherein the enable signal enables an asynchronous signal in the design; and
   driving an element of the design based on the enabled asynchronous signal.

2. The method of claim 1, wherein the enable signal is a clock enable signal and the asynchronous signal is a clock signal, wherein the clock signal drives the element of the design, and wherein the element of the design is included in a clock domain associated with the clock signal.

3. The method of claim 2, wherein the mapping is based on a number of elements associated with the clock domain and wherein enable signals associated with domains including a higher number of elements are enabled more frequently than enable signals associated with domains having a lower number of elements.

4. The method of claim 1, further comprising:
determining a length of the sequence of bits based on a number of interacting clock domains in the design and a number of elements clocked by each clock domain.

5. The method of claim 1, further comprising:
generating, simultaneously with the enable signal, a second enable signal associated with a second clock domain wherein the second clock domain is not interacting with a first clock domain associated with the enable signal.

6. The method of claim 1, further comprising repeating the steps of generating, mapping, generating, and driving for each capture and wherein the sequence of bits is a random sequence of bits.

7. The method of claim 1, wherein the mapping the sequence of bits to the combination comprises storing, in a decoding table, an association between values of the sequence of bits and allowed combinations to control multiple synchronous and/or asynchronous clock and/or reset signals in the design.

8. The method of claim 1, wherein a number of combinations enabling the asynchronous signal associated with a clock domain is equal to a number of sequential elements associated with the clock domain.

9. The method of claim 1, wherein the asynchronous signal is a reset/set signal.

10. The method of claim 9, wherein combinations enabling the reset/set signal are fewer than the combinations enabling a clock signal.

11. The method of claim 1, wherein the sequence of bits is generated by a scan chain independent of the one or more scan chains of the design.

12. A system comprising:
memory storing instructions; and
a processor, coupled with the memory and to execute the instructions for testing a design, the instructions when executed cause the processor to:
generate a sequence of bits,
map the sequence of bits to a combination,
generate an enable signal based on the combination, wherein the enable signal enables an asynchronous signal in the design, and
drive an element of the design based on the enabled asynchronous signal.

13. The system of claim 12, wherein the enable signal is a clock enable signal and the asynchronous signal is a clock signal, wherein the clock signal drives the element of the design, and wherein the element of the design is included in a clock domain associated with the clock signal.

14. The system of claim 12, wherein the processor is further configured to:
determine a length of the sequence of bits based on a number of interacting clock domains in the design and a number of elements clocked by each clock domain.

15. The system of claim 12, wherein the mapping the sequence of bits to the combination comprises storing, in a decoding table, an association between values of the sequence of bits and allowed combinations to control multiple synchronous and/or asynchronous clock and/or reset signals in the design.

16. The system of claim 12, wherein a number of combinations enabling the asynchronous signal associated with a clock domain is equal to a number of sequential elements associated with the clock domain.

17. The system of claim 12, wherein the signal comprises a reset/set signal and the mapping enables the reset/set signal less than a clock enable signal.

18. The system of claim 12, wherein the sequence of bits is a random sequence of bits and the system further comprising a pseudo random pattern generator configured to generate the random sequence of bits.

19. The system of claim 12, wherein the asynchronous signal is a clock signal or a reset/set signal.

20. A non-transitory computer readable medium comprising stored instructions for testing a design, which when executed by a processor, cause the processor to:
generate a sequence of bits;
map the sequence of bits to a combination;
generate an enable signal based on the combination, wherein the enable signal enables an asynchronous signal in the design; and
drive an element of the design based on the enabled asynchronous signal.

\* \* \* \* \*